United States Patent
Gorostegui

(10) Patent No.: US 9,054,668 B2
(45) Date of Patent: Jun. 9, 2015

(54) BROADBAND ABSORPTIVE-LOADING FILTER

(75) Inventor: Ignacio Gorostegui, Laguna Beach, CA (US)

(73) Assignee: BROADCOM CORPORATION, Irvine, CA (US)

( * ) Notice: Subject to any disclaimer, the term of this patent is extended or adjusted under 35 U.S.C. 154(b) by 471 days.

(21) Appl. No.: 13/435,961

(22) Filed: Mar. 30, 2012

(65) Prior Publication Data

US 2013/0257561 A1  Oct. 3, 2013

(51) Int. Cl.
*H01P 5/12* (2006.01)
*H03H 7/01* (2006.01)

(52) U.S. Cl.
CPC ............. *H03H 7/0115* (2013.01); *H03H 7/175* (2013.01); *H03H 7/1758* (2013.01); *H03H 7/1766* (2013.01)

(58) Field of Classification Search
CPC ... H03H 7/0115; H03H 7/175; H03H 7/1766; H03H 7/46; H03H 7/48; H01P 5/12
USPC .................................. 333/124–129, 132–136
See application file for complete search history.

(56) References Cited

U.S. PATENT DOCUMENTS

| | | | |
|---|---|---|---|
| 5,185,736 A | 2/1993 | Tyrrell et al. | |
| 5,319,482 A | 6/1994 | Tsuchiya et al. | |
| 5,991,308 A | 11/1999 | Fuhrmann et al. | |
| 6,377,640 B2 | 4/2002 | Trans | |
| 6,819,746 B1 | 11/2004 | Schneider et al. | |
| 6,904,110 B2 | 6/2005 | Trans et al. | |
| 6,947,857 B2 | 9/2005 | Jones et al. | |
| 7,042,983 B2 | 5/2006 | Bauer et al. | |
| 7,515,692 B2 | 4/2009 | Wang et al. | |
| 7,594,249 B2 | 9/2009 | Gurantz et al. | |
| 7,606,145 B2 | 10/2009 | Wang et al. | |
| 7,610,011 B2 | 10/2009 | Albrett | |
| 8,095,098 B2 | 1/2012 | Brooks et al. | |
| 8,170,814 B2 | 5/2012 | Wang et al. | |
| 8,264,298 B2 * | 9/2012 | Kenington | 333/126 |
| 2002/0097468 A1 | 7/2002 | Mecherle et al. | |
| 2002/0101632 A1 | 8/2002 | Meckler | |
| 2002/0122552 A1 | 9/2002 | Liu | |
| 2003/0086515 A1 | 5/2003 | Trans et al. | |
| 2005/0089027 A1 | 4/2005 | Colton | |
| 2005/0283815 A1 | 12/2005 | Brooks et al. | |
| 2005/0289632 A1 | 12/2005 | Brooks et al. | |
| 2006/0018460 A1 | 1/2006 | McCree | |
| 2006/0062363 A1 | 3/2006 | Albrett | |
| 2007/0121793 A1 | 5/2007 | Wang et al. | |
| 2007/0194933 A1 | 8/2007 | Shanks et al. | |
| 2007/0217338 A1 | 9/2007 | Wang et al. | |
| 2007/0274513 A1 | 11/2007 | Wang et al. | |

(Continued)

*Primary Examiner* — Robert Pascal
*Assistant Examiner* — Kimberly Glenn
(74) *Attorney, Agent, or Firm* — Foley & Lardner LLP

(57) ABSTRACT

In one embodiment, front end circuitry for an electronic appliance, the front end circuitry comprising: a first port configured to conduct signals from a signal source, the signals comprising a first signal and a second signal; a first filter coupled to the first port, the first filter configured to filter the first signal according to a first frequency band and output the filtered first signal for further processing; a second filter coupled to the first port and arranged in parallel with the first filter, the second filter configured to absorb the second signal according to a second frequency band that is a stopband for the first filter; and an impedance load coupled between an output of the second filter and ground.

20 Claims, 5 Drawing Sheets

(56) References Cited

U.S. PATENT DOCUMENTS

| | | |
|---|---|---|
| 2008/0231337 A1 | 9/2008 | Krishnaswamy et al. |
| 2009/0002213 A1 | 1/2009 | LaMarche et al. |
| 2009/0185664 A1 | 7/2009 | Wang et al. |
| 2010/0105315 A1 | 4/2010 | Albrett |
| 2010/0156437 A1 | 6/2010 | Cobb et al. |
| 2010/0283705 A1 | 11/2010 | Achour et al. |
| 2010/0311488 A1 | 12/2010 | Miller et al. |
| 2010/0311489 A1 | 12/2010 | Miller et al. |
| 2010/0311490 A1 | 12/2010 | Miller et al. |
| 2010/0311493 A1 | 12/2010 | Miller et al. |
| 2010/0311494 A1 | 12/2010 | Miller et al. |
| 2010/0311502 A1 | 12/2010 | Miller et al. |
| 2010/0312625 A1 | 12/2010 | Miller et al. |
| 2011/0111709 A1 | 5/2011 | Karacaoglu et al. |
| 2011/0175749 A1 | 7/2011 | Ellsworth, III |
| 2012/0074952 A1 | 3/2012 | Chappell et al. |
| 2012/0082068 A1 | 4/2012 | Yang et al. |
| 2012/0112851 A1 | 5/2012 | Manssen et al. |
| 2012/0112852 A1 | 5/2012 | Manssen et al. |
| 2012/0176756 A1 | 7/2012 | Gailus et al. |

\* cited by examiner

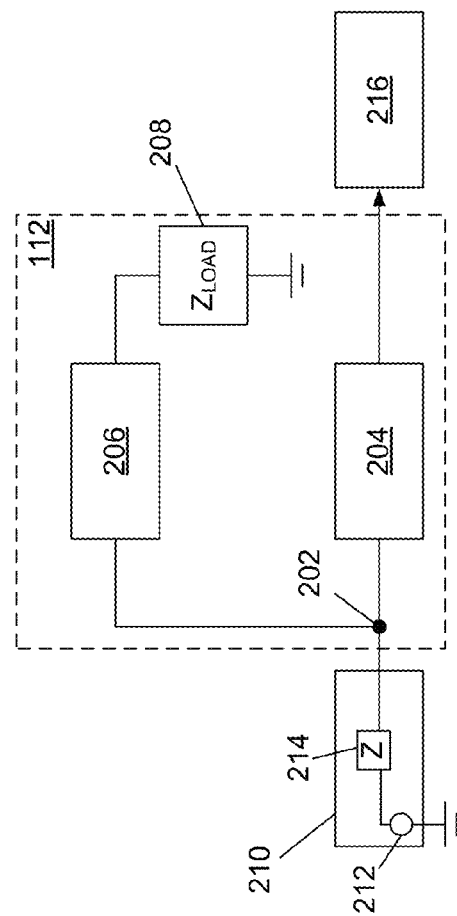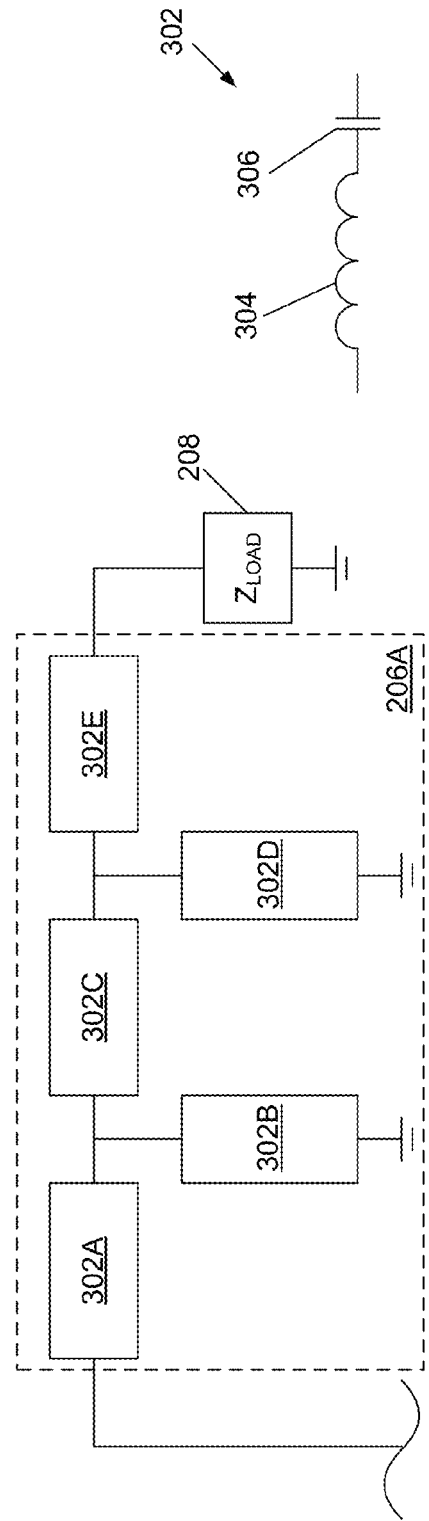

BROADBAND ABSORPTIVE-LOADING FILTER

TECHNICAL FIELD

The present disclosure is generally related to signal processing and, more particularly, is related to filters and reflection mitigation.

BACKGROUND

As electronic appliances, such as settop boxes, and their constituent components, such as front ends, become more complex, a wide variety of signals need to be supported. These signals include those used in satellite, cable, Multi-Media Coaxial (MoCA), terrestrial and other wired and/or wireless communication environments. One concern is the potential for interaction and possibly interference between the various signals over a wideband input frequency spectrum, prompting certain industry-recognized coexistence requirements. There exists a variety of solutions to meet or at least address such coexistence requirements, including the implementation of filters, diplexers, triplexers and/or frequency converters.

One particular concern in such systems is the reflection of signals at the input to certain components, such as at the input to a settop box comprising front end circuitry comprising an input port followed by a passband filter (and optionally a resistive pad). Typically, return loss in a filter passband is acceptable and provides proper circuit loading. In the filter stopband, however, the return loss becomes reflective and all or a significant portion of the signal energy is reflected back to the source. This reflection may cause a non-compliant broadband return loss issue at the input to, or at a component upstream of, the settop box or an unwanted reflected energy back into a component of another electronic appliance, such as a mixer or other circuit of a transceiver device or other signal source.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the disclosed embodiments. Moreover, in the drawings, like reference numerals designate corresponding parts throughout the several views.

FIG. 2 is a block diagram that illustrates an example embodiment of a BAL filter implemented in a front end circuitry.

FIG. 3A is a block diagram of an example embodiment that illustrates a BAL filter with an impedance load.

FIG. 3B is a schematic diagram that illustrates a reactive component of an embodiment of a BAL filter.

DETAILED DESCRIPTION

Figure 1:
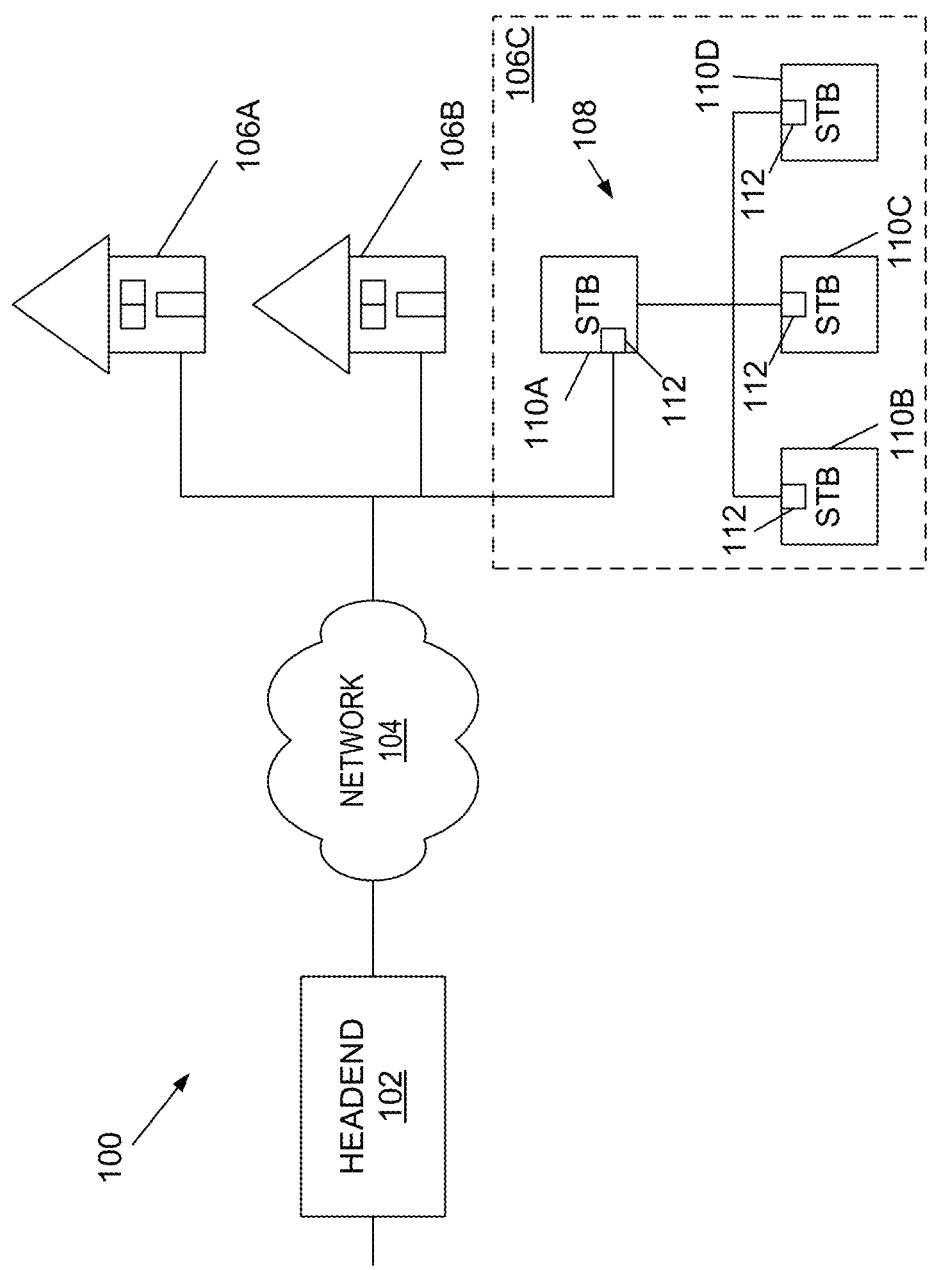
FIG. 1 is block diagram that illustrates an example environment in which certain embodiments of a broadband absorptive-loading (BAL) filter may be implemented.

Certain embodiments of an invention comprising a broadband absorptive-loading filter and associated methods are disclosed that enables signal coupling and circuit termination in a multimedia, signal processing environment. For instance, in a broadband communication system such as cable or satellite television, or Internet-based television, among other broadband systems, certain embodiments of a broadband absorptive-loading filter minimize interaction between a plurality of different signals over a wideband input frequency spectrum. In one embodiment employed in a cable or satellite television environment, a broadband absorptive-loading filter comprises a reactive network coupled between an input port and an impedance load and also disposed in parallel arrangement with an input filter, such as a low pass or high pass filter. The broadband absorptive-loading filter absorbs signals that would otherwise be reflected back to the source of the signal (e.g., outside the passband of the input filter, referred to as the stopband).

Digressing briefly, settop boxes or other electronic appliances in a network that are designed to handle multiple input signals provide adequate broadband return loss. This broadband return loss is a requirement from service providers that allow them to maintain certain fidelity on their networks. As newer settop boxes are introduced into the network that only support a subset of the input signals, the broadband return loss requirement becomes an issue. For instance, front end circuitry may provide filtering for the signal of interest, yet reject or reflect unwanted signals back on the network. One solution is to provide a broadband absorptive-loading filter, which makes the front end solution compliant to the broadband return loss requirement.

Another signal processing environment comprises newer frequency plans to address the Internet protocol (IP) low noise block (LNB) market with wideband analog to digital (A/D) demodulators. For instance, such wideband converters are typically followed by a filter stage. To avoid the reflected energy from the filter stopband returning to the mixer and generating other unwanted harmonics, the addition of a broadband absorptive-loading filter absorbs most if not all of the unwanted energy. In other words, in view of these and other signal processing applications, having a broadband absorptive-loading filter according to certain embodiments provides an innovative solution by providing a constant load (acceptable return loss) over the entire input frequency spectrum.

Having summarized certain features of a broadband absorptive-loading filter of the present disclosure, reference will now be made in detail to the description of the disclosure as illustrated in the drawings. While the disclosure is described in connection with these drawings, there is no intent to limit it to the embodiment or embodiments disclosed herein. For instance, in the description that follows, the focus is on the use of a broadband absorptive-loading filter in the context of a cable television network and a MoCA subsystem or sub-network residing in one or more subscriber locations (e.g., residence, business, etc.), with the understanding that other environments, such as satellite, terrestrial, phone, and IP-based environments, among other systems or networks, may likewise benefit from the disclosed embodiments, and hence are contemplated to be within the scope of the disclosure. In addition, though described in the context of benefits to a system comprising plural electronic appliances arranged in one or more networks, it should be appreciated that the principles of certain embodiments of a broadband absorptive-loading filter apply within a given electronic appliance, and hence similar benefits inure within a host appliance as well as outside of an electronic appliance among others in a network.

Further, although the description identifies or describes specifics of one or more embodiments, such specifics are not necessarily part of every embodiment, nor are all various stated advantages associated with a single embodiment. On the contrary, the intent is to cover all alternatives, modifications and equivalents included within the spirit and scope of the disclosure as defined by the appended claims. Further, it should be appreciated in the context of the present disclosure that the claims are not necessarily limited to the particular embodiments set out in the description.

Attention is now directed to FIG. 1, which illustrates an example environment 100 in which certain embodiments of a broadband absorptive-loading filter may be implemented. In the depicted example, the environment 100 comprises a broadband cable television network. One having ordinary skill in the art should appreciate in the context of the present disclosure that the example environment 100 is merely illustrative, and that other environments are contemplated to be within the scope of the disclosure, including satellite, terrestrial, Internet, cellular, phone (e.g., landline), among other wired and/or wireless networks. In the depicted example of FIG. 1, the environment 100 comprises a headend 102, a network 104, and a plurality of subscriber locations 106 (e.g., 106A, 106B, and 106C). The headend 102 may receive and process multimedia content (e.g., video, audio (including voice), graphics, and/or data) from servers or storage devices of one or more upstream providers (not shown) and distribute the multimedia content (among other, perhaps locally generated multimedia content) over the network 104 to the plurality of subscriber locations 106. The network 104 may be a hybrid-fiber coaxial (HFC) network, among other types of networks, such as digital subscriber line (DSL), or a mix of a plurality of networks, including a mix of wired and wireless networks.

The plurality of subscriber locations 106 may each comprise a tap or generally a network interface connection to receive the multimedia content from the network 104. Note that in some embodiments, the connection shown in FIG. 1 from the network 104 may be omitted and each subscriber location may comprise a satellite dish, or in some embodiments, there may be a mix of subscriber locations 106 with some equipped with satellite dishes and others equipped for connection to the network 104. In addition, each of the plurality of subscriber locations 106 comprises one or more electronic appliances, the electronic appliances equipped with a broadband absorptive-loading filter. For instance, referring to the subscriber location 106C as one illustrative example, shown is an internal network of a plurality of electronic appliances. In particular, the internal network is configured in one embodiment as a Multi-Media Coaxial (MoCA) network 108 having plural electronic appliances configured as settop boxes (STB) 110 (e.g., 110A, 110B, 110C, and 110D).

For instance, tuning functionality may occur at the settop box 110A, which serves a master function in providing the multimedia content received over the network 104 to the plural settop boxes 110B-110D serving the functionality of slaves. The settop boxes 110 may be integrated in another device, such as a television, or standalone units that are coupled to another device (e.g., television). Each of the plural settop boxes 110 may comprise front end circuitry 112, the front end circuitry comprising an input filter, and a broadband absorptive-loading filter that absorbs reflective content to prohibit or mitigate interference among other settop boxes 110 or other electronic appliances (e.g., located in other subscriber locations 106A, 106B, etc.). For instance, in the scenario where the settop box 110A serves a function as a signal source, the front end circuitry of the settop box 110C, for instance, receives the signal or signals from the settop box 110A and filters the signals in a passband and absorbs the signals in a stopband.

It should be appreciated that the electronic appliance 110 depicted in FIG. 1 is for illustrative purposes, and that in some embodiments, the electronic appliance may be other types of devices, such as a cellular phone, smartphone, landline phone, personal digital assistant (PDA), tablet, laptop or other computing device, television, or multimedia or multichannel playback device, etc.

Having described an example environment 100 in which certain embodiments of a broadband absorptive-loading filter may be implemented, attention is now directed to FIG. 2, which shows one embodiment of front end circuitry, such as front end circuitry 112. One having ordinary skill in the art should appreciate in the context of the present disclosure that the example front end circuitry 112 is merely illustrative, and that additional and/or other components may be used in some embodiments to achieve similar functionality. As shown in FIG. 2, in one embodiment, the front end circuitry 112 comprises an input port 202, a input filter 204, a broadband absorptive-loading filter 206, and an impedance load 208 ($Z_{load}$). The input port 202 may comprise an input connector (e.g., coaxial connector), or a trace serving as a node on a printed circuit board, among other types of conductors of an incoming signal or signals. In other words, the input port 202 serves as an interface between a signal source 210 and the input filter 204 and the broadband absorptive-loading filter 206.

The signal source 210 may comprise the conductive medium over which one or more electronic signals are carried, as well as the current and/or voltage parameters of that signal. For instance, the signal source 210 may be represented as a voltage source 212 coupled at one end to ground and at the other end to a characteristic impedance 214 of the conductive medium and/or interface (e.g., coaxial cable, coaxial cable plus input connector, etc.). In some embodiments, an equivalent current source and source impedance may be used. In some embodiments, the signal source 210 comprises a device or component that provides the voltage and the characteristic impedance (e.g., a transceiver, a mixer, among other components serving as a source of a signal and having a characteristic source impedance).

The input filter 204 may comprise one of a variety of types of filters to filter a signal received from the signal source 210. For instance, in one embodiment, the input filter 204 may comprise a low pass filter. In some embodiments, the input filter 204 may comprise a high pass filter. The input filter 204 comprises a frequency band that provides a filtering function for the desired frequency of interest (frequency band or passband) of a signal received at the input port 202, and otherwise inhibits or prohibits the passage of a signal outside of the frequency band (stopband). For instance, in the case of an input filter 204 configured as a low pass filter, signals are filtered by the input filter 204 (the passband), and beyond a defined frequency, the signal amplitude falls off or degrades significantly (beyond a 3 dB point, for instance), the latter band referred to as a stopband. The passband signals are provided from the input filter 204 to signal processing circuitry 216, which processes the signal (e.g., change the gain, demodulate the passband signal, parse and/or extract data, etc.) according to well-known post filtering functions.

The broadband absorptive-loading filter 206 is also coupled to (e.g., connected) to the input port 202, and is configured to absorb signals in the stopband to prohibit or mitigate reflectivity that may potentially be returned back to the signal source (and possibly degrade the signal). The broadband absorptive-loading filter 206 is connected in parallel with the input filter 204 such that the following conditions with regard to impedance totals $z_{total}$) are met:

$$z_{total}(w) = z_{filter}(w) \| Z_{BAL}(w) \text{ or } y_{total}(w) = y_{filter}(w) + y_{BAL}(w) \quad (1)$$

where $z_{filter}$ is the impedance of the input filter 204 and $z_{BAL}$ is the impedance of the broadband absorptive-loading filter 206, and w represents the frequency. Transconductance is represented with "y". The $z_{load}$ (e.g., impedance load 208) coupled to the broadband absorptive-loading filter 206 comprises a value that is chosen based on the source impedance (e.g., impedance 214, "z") according to the following:

$$z_{load} = z_{source} \quad (2)$$

It is noted that $z_{total}$ should comply with the required return loss (RL), which in one implementation is according to the following:

$$RL(dB) = -20 \log(RL) \text{ and } RL = (z_{total} - z_{source})/(z_{total} + z_{source}) \quad (3)$$

FIG. 3A provides an example embodiment of a broadband absorptive-loading filter 206A, which comprises a network of plural reactive elements 302 (e.g., 302A-302E). One having ordinary skill in the art should appreciate in the context of the present disclosure that the example broadband absorptive-loading filter 206A is merely illustrative, and that additional and/or fewer components may be used in some embodiments. In the depicted example, reactive element 302A is configured to receive an incoming signal (e.g., from input port 202), and at is output end, is coupled to inputs of reactive elements 302B and 302C. Reactive element 302B is coupled to ground at its output end. Reactive element 302C is coupled at its output to inputs of reactive elements 302D and 302E. Reactive element 302D is coupled at its output end to ground. Reactive element 302E is coupled at its output to impedance load 208, the latter which is coupled to ground. FIG. 3B shows one example of a reactive element 302, which in one embodiment comprises an inductor 304 (or equivalent inductive element) and a capacitor 306 (or equivalent capacitive element). In some embodiments, additional components may comprise the reactive element 302.

Figure 4:
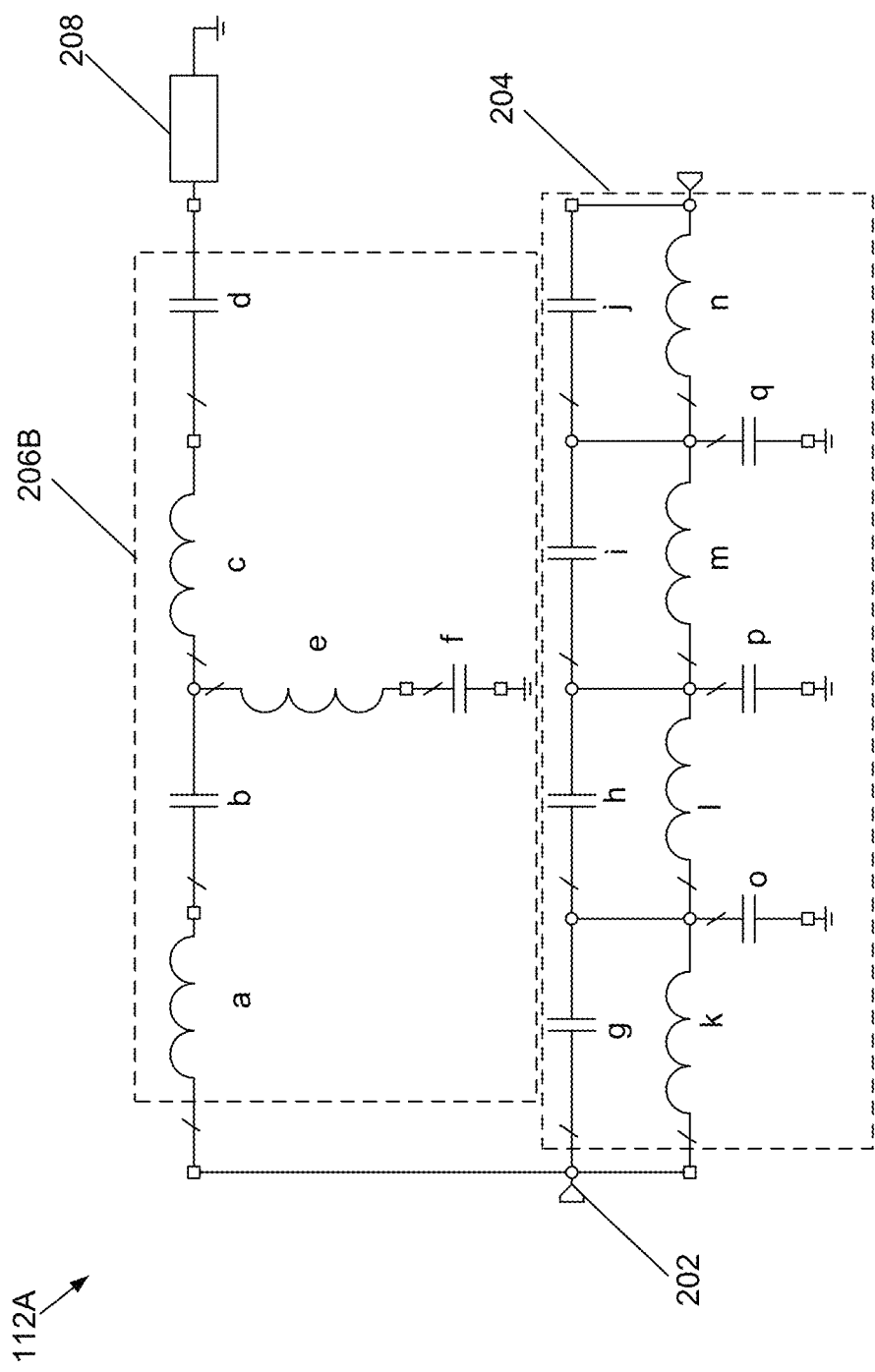
FIG. 4 is a schematic diagram that illustrates an example embodiment of a front end circuitry comprising a parallel configuration of a BAL filter and an input filter.

FIG. 4 is a schematic diagram that illustrates an example embodiment of at least a portion of front end circuitry, referred to as front end circuitry 112A. One having ordinary skill in the art should appreciate in the context of the present disclosure that the example front end circuitry 112A is merely illustrative, and that additional and/or fewer components may be used in some embodiments. Depicted in this example is the input port 202, input filter 204, and an embodiment of a broadband absorptive-loading filter 206B. The input ends of the input filter 204 and the broadband absorptive-loading filter 206B are coupled to the input port 202. The output of the broadband absorptive-loading filter 206B is coupled to the impedance load 208, which is grounded. Some example, non-limiting inductive or capacitive values for the components (denoted with the lower-case letters a-q located adjacent to the given component) illustrated in FIG. 4 are as follows, with the understanding that some embodiments may have different values: a (1 nano-Henry, or nH), b (1.5 pico-Farad, or pF), c (1 nH), d (1.5 pF), e (4.3 nH), f (100 pF), g (0.5 pF), h (3 pF), j (0.8 pF), j (2.2 pF), k (12 nH), l (5.6 nH), m (1.2 nH), n (4.3 nH), o (3 pF), p (4.7 pF), and q (4.3 pF).

Figure 5:
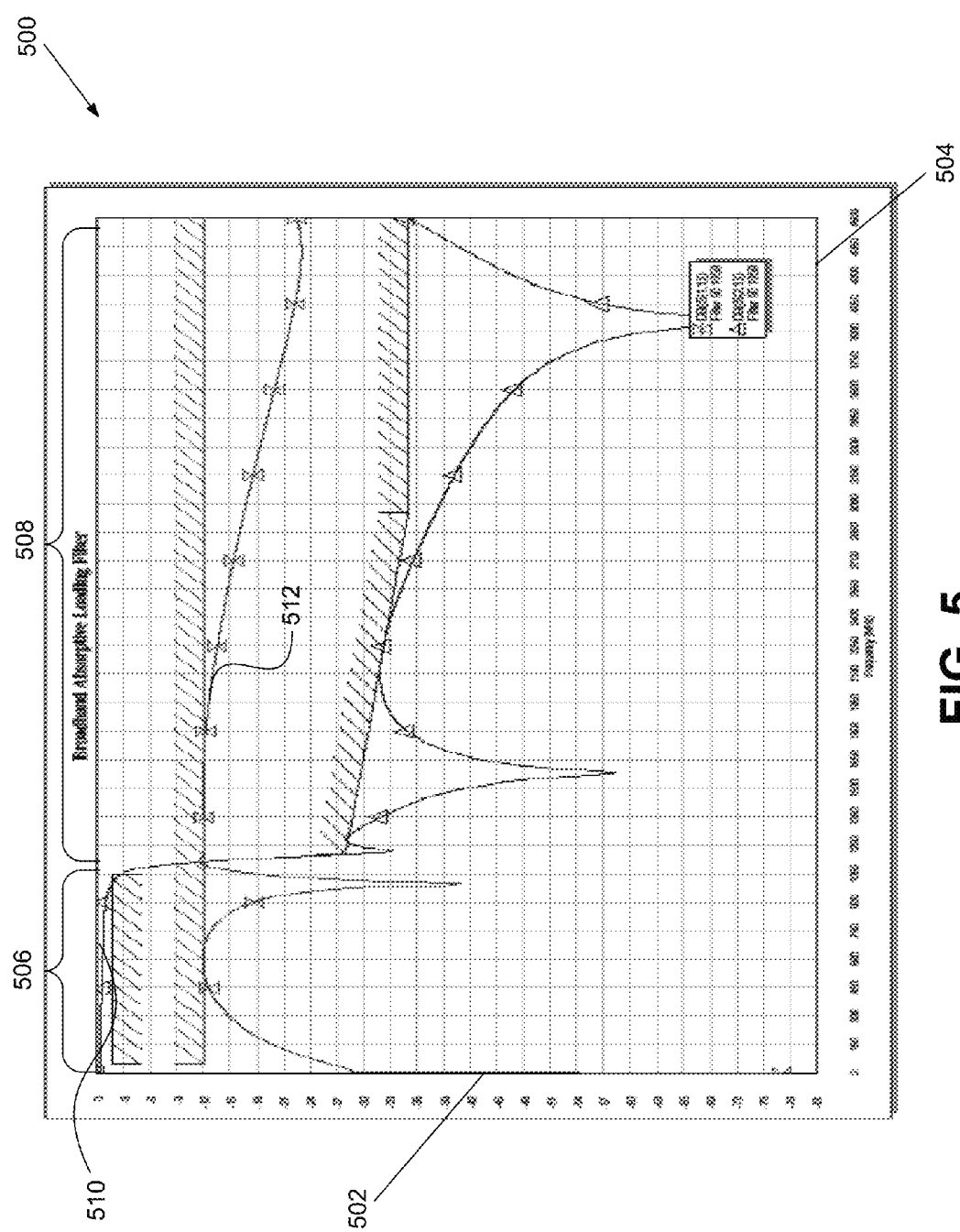
FIG. 5 is a graph diagram that illustrates certain performance features of an example embodiment of a front end circuitry comprising a parallel configuration of a BAL filter and an input filter.

FIG. 5 is an example graph diagram 500 that illustrates certain performance measures of the front end circuitry 112A shown in FIG. 4. It should be appreciated that different performance measures may be depicted based on a difference in values used or different topologies for the front end circuitry 112. As shown, the graph diagram 500 comprises a vertical axis 502 corresponding to gain (in dB) and a horizontal axis 504 corresponding to frequency (in MHz). The graph diagram 500 provides a plot of performance measures (e.g., frequency response along with return loss and insertion loss) for the front end circuitry 112A comprising the input filter 204 configured as a low pass filter, the broadband absorptive-loading filter 206B with a network of reactive elements (e.g., three (3) of them as arranged in FIG. 4), and an impedance load 208. Shown are two primary regions—a passband 506 and a stopband 508. As explained above, in general, in a filter stopband, the return loss becomes reflective and all or most of the signal energy is reflected back to the source. Such a reflection may cause a non-compliant broadband return loss at the input port of an electronic appliance or unwanted reflected energy back into a mixer circuit or other circuit. In the plot depicted in FIG. 5, and in particular in the range from 50-1050 MHz, pass band insertion loss (shown in passband 506) is equal to about 2 dB, as shown by plot 510. Also, as shown by plot 512, the return loss over the passband 506 and stopband 508 is substantially constant (e.g., at or below −12 dB).

This depicted performance is in contrast to conventional, known front end circuitry that uses, for instance, resistive pads. For instance, in such conventional systems, the insertion loss (depicted in the present, non-conventional example by plot 510) is increased (e.g., attenuation occurs) by the resistive pad (e.g., a 6 dB pad is required to keep the filter stop band return loss at or below −12 dB), the insertion loss comparable to the rating or performance of the pad (e.g., 6 dB, versus approximately −2 dB in FIG. 5). Further, without a pad in conventional systems (or without a broadband absorptive-loading filter 206), the return loss over the stopband 508 becomes 0 dB, which results in high (e.g., higher) reflectivity. The front end circuitry 112A, with its parallel combination of the input filter 204 and the broadband absorptive-loading filter 206B, enables a constant load and acceptable return loss over the entire input frequency spectrum without disrupting the original performance parameters of the input filter 204. In other words, in the example depicted in FIG. 5, the broadband absorptive-loading filter 206B helps to maintain the filter return loss to under −12 dB across the entire bandwidth of interest, without double loading the signal source, and without degrading the filter passband insertion loss.

Figure 6:
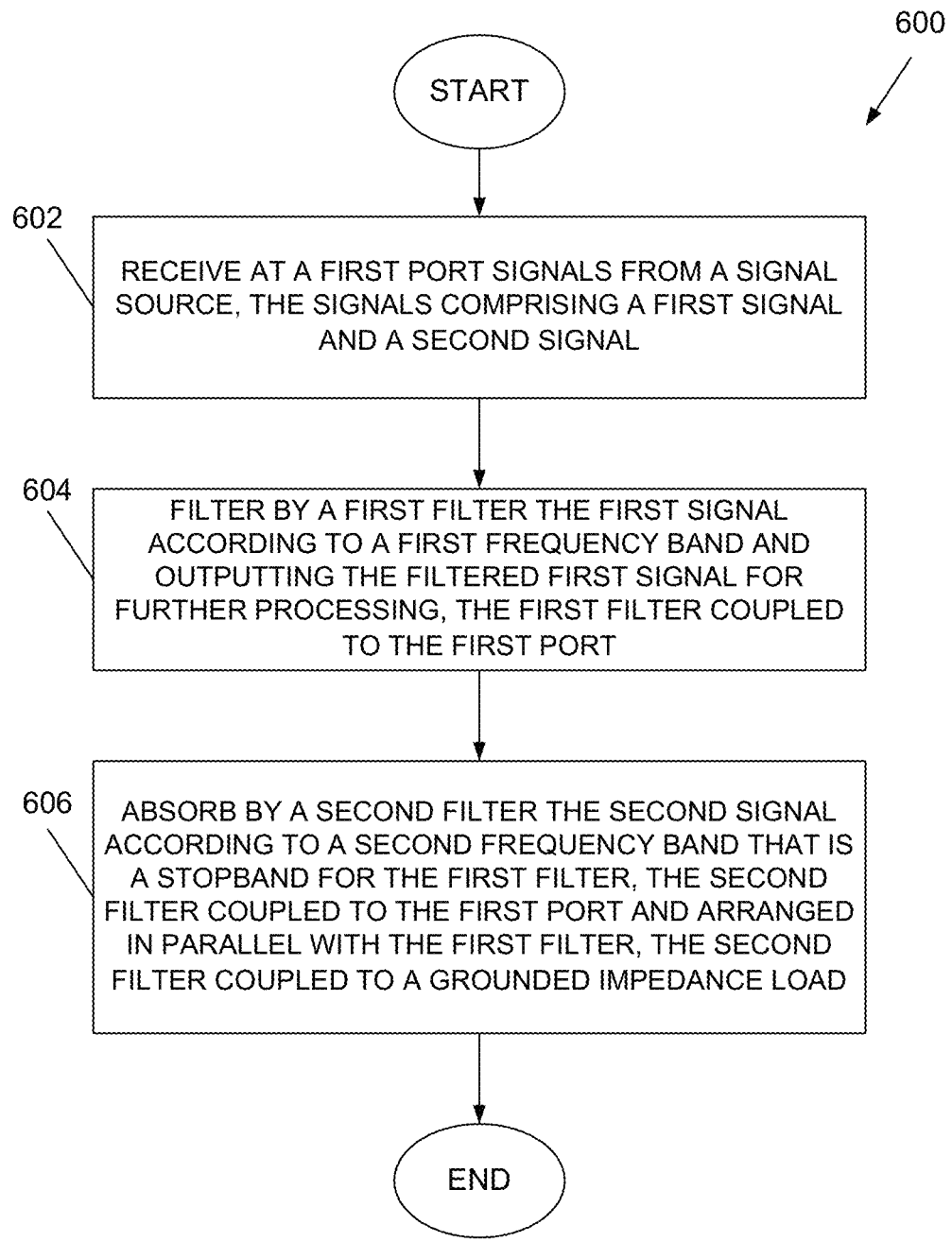
FIG. 6 is a flow diagram that illustrates an example embodiment of a method of processing an input signal using broadband absorptive-loading.

In view of the above description, it should be appreciated that one method embodiment, depicted in FIG. 6 and denoted as method 600, comprises receiving at a first port signals from a signal source, the signals comprising a first signal and a second signal (602); filtering by a first filter the first signal according to a first frequency band and outputting the filtered first signal for further processing, the first filter coupled to the first port (604); and absorbing by a second filter the second signal according to a second frequency band that is a stopband for the first filter, the second filter coupled to the first port and arranged in parallel with the first filter, the second filter coupled to a grounded impedance load (606).

Hence, one advantage of using certain embodiments of a broadband absorptive-loading filter is improved performance and/or cost savings. For instance, implementing a filter with such a topology as disclosed enables a cost effective and technically sound solution to a difficult requirement. As noted above, in the past, some of the return loss issues have been solved by a broadband resistive pad, which may introduce other issues into front end circuitry. When using pads for a broadband match, the insertion loss affects noise figure and increases the amount of gain that is required in the design.

Note that the above described embodiments contemplate tweaking the broadband absorptive-loading filter (e.g., as implemented on a printed circuit board) for each electronic appliance, in some embodiments, a more automated tuning may be implemented where the broadband absorptive-loading filter is embedded in a semiconductive chip that may incorporate registers to control/adjust the various capacitive values.

It should be emphasized that the above-described embodiments of the present disclosure are merely possible examples of implementations, merely set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

At least the following is claimed:

1. Front end circuitry for an electronic appliance, the front end circuitry comprising:
    a first port configured to conduct signals from a signal source, the signals comprising a first signal and a second signal;
    a first filter coupled to the first port, the first filter configured to filter the first signal according to a first frequency band and output the filtered first signal for further processing, the first filter comprising one of a low pass filter or a high pass filter;
    a second filter coupled to the first port and arranged in parallel with the first filter, the second filter configured to absorb the second signal according to a second frequency band that is a stopband for the first filter; and
    an impedance load coupled between an output of the second filter and ground.

2. The front end circuitry of claim 1, wherein the second filter consists of a reactive filter.

3. The front end circuitry of claim 1, wherein the first filter comprises a low pass filter.

4. The front end circuitry of claim 1, wherein the first filter comprises a high pass filter.

5. The front end circuitry of claim 1, wherein the second filter consists of an LC network.

6. The front end circuitry of claim 1, wherein the impedance load comprises an impedance value that matches an impedance value of the signal source.

7. The front end circuitry of claim 1, wherein the combination of the first filter and the second filter is configured to cause a filter return loss of a substantially constant value across the first frequency band and the second frequency band.

8. The front end circuitry of claim 7, wherein the value is approximately −12 dB.

9. The front end circuitry of claim 1, wherein the first filter is configured to impose a band filter loss across a passband that is substantially unaffected by the combination of the second filter and the first filter.

10. The front end circuitry of claim 9, wherein the band filter loss comprises a value that is less than or approximately equal to −2 dB.

11. The front end circuitry of claim 1, wherein the signal source either comprises a transceiver or a mixer circuit, the mixer circuit configured to receive an oscillator signal.

12. The front end circuitry of claim 1, wherein the signal source comprises a voltage or current parameter and a characteristic impedance.

13. An electronic appliance, comprising:
    front end circuitry comprising:
        a first port configured to conduct signals from a signal source, the signals comprising a first signal and a second signal;
        a first filter coupled to the first port, the first filter configured to filter the first signal according to a first frequency band and output the filtered first signal for further processing;
        a second filter coupled to the first port and arranged in parallel with the first filter, the second filter configured to absorb the second signal according to a second frequency band that is a stopband for the first filter; and
        an impedance load coupled between an output of the second filter and ground, the impedance load comprising an impedance value that matches an impedance value of the signal source.

14. The electronic appliance of claim 13, wherein the first filter comprises either a low pass filter or a high pass filter.

15. The electronic appliance of claim 13, wherein the second filter consists of an LC network.

16. The electronic appliance of claim 13, wherein the combination of the first filter and the second filter is configured to cause a filter return loss of a substantially constant value across the first frequency band and the second frequency band.

17. The electronic appliance of claim 13, wherein the first filter is configured to impose a band filter loss that is substantially the same as a band filter loss imposed by a combination of the second filter and the first filter.

18. A broadband absorptive-loading filter method, the method comprising:
    receiving at a first port signals from a signal source, the signals comprising a first signal and a second signal;
    filtering by a first filter the first signal according to a first frequency band and outputting the filtered first signal for further processing, the first filter coupled to the first port;
    absorbing by a second filter the second signal according to a second frequency band that is a stopband for the first filter, the second filter coupled to the first port and arranged in parallel with the first filter, the second filter coupled to a grounded impedance load;
    causing by a combination of the first filter and the second filter a filter return loss of a substantially constant value across the first frequency band and the second frequency band; and
    imposing by the first filter a band filter loss that is substantially the same as a band filter loss imposed by the combination of the second filter and the first filter.

19. Front end circuitry for an electronic appliance, the front end circuitry comprising:
    a first port configured to conduct signals from a signal source, the signals comprising a first signal and a second signal;
    a first filter coupled to the first port, the first filter configured to filter the first signal according to a first frequency band and output the filtered first signal for further processing;
    a second filter coupled to the first port and arranged in parallel with the first filter, the second filter configured to absorb the second signal according to a second frequency band that is a stopband for the first filter; and an impedance load coupled between an output of the second filter and ground;

wherein the combination of the first filter and the second filter is configured to cause a filter return loss of a substantially constant value across the first frequency band and the second frequency band.

20. Front end circuitry for an electronic appliance, the front end circuitry comprising:

a first port configured to conduct signals from a signal source, the signals comprising a first signal and a second signal;

a first filter coupled to the first port, the first filter configured to filter the first signal according to a first frequency band and output the filtered first signal for further processing;

a second filter coupled to the first port and arranged in parallel with the first filter, the second filter configured to absorb the second signal according to a second frequency band that is a stopband for the first filter; and an impedance load coupled between an output of the second filter and ground;

wherein the first filter is configured to impose a band filter loss across a passband that is substantially unaffected by the combination of the second filter and the first filter.

* * * * *